(12) United States Patent
Kraska et al.

(10) Patent No.: US 6,506,542 B1
(45) Date of Patent: Jan. 14, 2003

(54) DEVELOPER AND PROCESS FOR PREPARING FLEXOGRAPHIC PRINTING FORMS

(75) Inventors: Ursula Annerose Kraska, Weiterstadt (DE); Rudolf Leonard Osowski, Dreieich (DE)

(73) Assignee: E.I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 09/646,515

(22) PCT Filed: Mar. 16, 1999

(86) PCT No.: PCT/US99/05567

§ 371 (c)(1),
(2), (4) Date: Sep. 15, 2000

(87) PCT Pub. No.: WO99/47975

PCT Pub. Date: Sep. 23, 1999

(51) Int. Cl.[7] .......................... G03F 7/027; G03F 7/09; G03F 7/30; G03F 7/32; G03F 7/40
(52) U.S. Cl. ................. 430/306; 430/300; 430/302; 430/331
(58) Field of Search ............................... 430/306, 331, 430/300, 302

(56) References Cited

U.S. PATENT DOCUMENTS

| 4,177,074 A | 12/1979 | Proskow |
|---|---|---|
| 4,621,044 A | 11/1986 | Fujikawa |
| 5,075,192 A | 12/1991 | Fryd et al. |
| 5,175,076 A | 12/1992 | Ishikawa et al. |
| 5,300,419 A | 4/1994 | Seto et al. |
| 5,565,363 A * | 10/1996 | Iwata et al. ............ 436/2 |
| 5,679,485 A | 10/1997 | Suzuki et al. |
| 5,721,094 A | 2/1998 | Komatsu et al. |
| 5,723,253 A | 3/1998 | Higashino et al. |
| 5,766,821 A | 6/1998 | Muramatsu et al. |
| 5,834,176 A | 11/1998 | Ishikawa et al. |

FOREIGN PATENT DOCUMENTS

| EP | 0784232 | 7/1997 |
|---|---|---|
| JP | 6297829 | 9/1994 |

OTHER PUBLICATIONS

Rewopol CHT12, CAS Nr. 93 165–97–0, EINECS Nr. 296–986–7, Jul. 3, 1995, WITCO Surfactants GmbH.

* cited by examiner

*Primary Examiner*—Janet Baxter
*Assistant Examiner*—Sin J. Lee
(74) *Attorney, Agent, or Firm*—Thomas H. Magee

(57) ABSTRACT

An aqueous developer for photopolymerizable flexographic printing plates containing a combination of an amino alcohol and/or an amino carboxylic acid and a surfactant or a combination of two surfactants and a process for preparing flexographic printing forms by the use of this developer are described.

10 Claims, No Drawings

DEVELOPER AND PROCESS FOR PREPARING FLEXOGRAPHIC PRINTING FORMS

BACKGROUND OF THE INVENTION

1. Field of the Invention

The invention involves an aqueous developer and a process for preparing flexographic printing forms by imagewise exposure of a recording material, washing off the uncrosslinked portions of the layer with a special aqueous developer, and drying the resulting treated recording material.

2. Description of Related Art

The use of photopolymerizable plates for preparing flexographic printing forms is known. The printing surface is produced by imagewise exposure of a layer that is photopolymerizable by actinic radiation and by subsequently removing the unexposed, unphotopolymerized areas of the printing plate. Aqueous solutions or organic solvents are usually employed as the developer, depending on the binder.

More and more aqueous developers have been used in recent years due to their lower environmental impact and decreased health hazard. Examples of aqueous developers being used are aqueous solutions of alkali metal hydroxides or carbonates and aqueous solutions of ionic or nonionic surfactants. Developers containing surfactants are described in JP6-297829.

The washoff process is conducted mostly in washoff devices with rotating brushes of various materials. Developers containing a surfactant frequently have a low washoff rate.

Therefore, the problem involved in the present invention was to improve the washoff process for aqueous-developable flexographic printing plates, in particular, to increase washoff rate.

SUMMARY OF THE INVENTION

This problem is solved by an aqueous developer for photopolymerizable flexographic printing plates containing a) a combination of at least one amino alcohol and/or at least one amino carboxylic acid with at least one surfactant or b) a combination of at least two surfactants, and by a process for preparing flexographic printing forms by using this developer.

The developer of the present invention led surprisingly, to washoff rates significantly higher than with conventional developers containing only a surfactant. The advantage of the developer of the present invention was all the more surprising at JP6-297829 discloses that amino alcohols are supposed to have no effect on the washoff rate.

DESCRIPTION OF THE PREFERRED EMBODIMENTS

The present aqueous developer contains, as components essential to the invention, at least one amino alcohol or at least one amino carboxylic acid in combination with a surfactant. Suitable amino alcohols can contain one or more amino groups and also one or more hydroxy groups. Suitable amino carboxylic acids can contain one or more amino groups and also one or more carboxyl groups. Preferred amino alcohols and amino carboxylic acids have the formula $R^1_x R^2_y R^3_z N$, wherein $R^1=H$; $R^2=-C_n H_{2n+1-m}-(OH)_m$ for the amino alcohols or $R^2=-C_n H_{2n+1-m}-(COOH)_m$ for the amino carboxylic acids, wherein $R^3$=alkyl, aryl, substituted alkyl, or substituted aryl groups; $x=0-3$; $y=1-3$; $z=0-2$; $n=1-15$; $m=n-1$; and $X+y+z=3$. Examples of suitable amino alcohols are 1-amino-2-propanol, 2-amino-2-ethyl-1,3-propanediol, N-butyl-diethanol, triethanolamine, 3-diethylamino-1,2-propanediol, 2-amino-2-methyl-1-propanol, 2(N-benzyl-N-methylamino)ethanol, 2-amino-1-phenyl-1,3-propanediol, 2-(2-aminoethylamino)ethanol, diisopropylamino-1,2-propanediol, and tris(hydroxymethyl) aminomethane. Triethanolamine, 3-diethylamino-1,2-propanediol, and tris(hydroxymethyl)aminomethane are particularly preferred. Preferred amino carboxylic acids are nitrilotriacetic acid, serine, aspartic acid, and polyaspartic acid. The quantity of amino alcohols or amino carboxylic acids is preferably 0.05 to 2.0 percent by weight, particularly 0.1 to 1.0 percent by weight.

The quantity of surfactant is 0.1 to 5 percent by weight, preferably 0.1 to 2 percent by weight. All known nonionic and ionic (anionic, cationic, and amphoteric) surfactants can be used in the sense of the invention, combined with amino alcohols or amino carboxylic acids as well as with each other. Examples of suitable surfactants are sodium dodecyl-benzene sulfonate, sodium lauryl sulfate, sodium 2-ethylhexylsulfate, ethylenediamine triacetate-coconut alkylacetamide trisodium salt, diisooctyl sulfosuccinate sodium salt, tricarboxylmethyl diaminoalkylamide, lanolin polyglycol ether, sodium lauryl sulfate, phenol polyglycol ether, amphoteric glycine derivatives, and polyoxyethylene glycerol oleoricinolates. Ethylenediamine triacetate-coconut alkylacetamide trisodium salt, diisooctyl sulfosuccinate sodium salt, sodium lauryl sulfate, and polyoxyethylene glycerol oleoricinolates are particularly preferred. The present aqueous developer can also comprise a combination of at least two surfactants as described above in aqueous solution.

The present developer is prepared by dissolving the appropriate quantities of the components to be used in water before the development process. The developer of the present invention can be used in all conventional washoff devices, preferably in high-quality steel devices. All current brush materials, such as, for example, nylon, polyester, or polypropylene, can be used. The washoff process is conducted preferably at an elevated temperature, usually at $\geq 30°$ C., particularly at $50°$ C.

The present developer is suitable for developing aqueous-developable recording materials having photopolymerizable layers. These layers contain preferably hydrophilic polymers optional hydrophobic polymers, photopolymerizable monomers, photoinitiators, and added auxiliaries, such as plasiticizers, fillers, stabilizers, dyes, inhibitors, etc.

Aqueous-developable printing plates contain, as an essential binder, polymers having hydrophilic groups, such as, for example, hydroxyl, carboxyl, amino, nitrile, sulfate, and phosphate groups, or combinations of these groups. Examples are polyvinyl alcohols, polyvinyl acetates, copolymers of (meth)acrylic acid and (meth)acrylates, cellulose derivatives, polyesters, polyamides, carboxylated butadiene/acrylonitrile polymers, core-shell polymers having hydrophilic groups in the shell polymers, or block copolymers having hydrophobic and hydrophilic groups. Also useful are mixtures of these various polymers or mixtures with hydrophobic binders, such as thermoplastic elastomer copolymers, particularly with thermoplastic elastomeric block copolymers. Linear and radial polystyrene/polybutadiene/polystyrene or polystyrene/polyisoprene/polystyrene block copolymers are preferred. Aqueous-developable flexographic printing plates are described in U.S. Pat. No. 5,175,076; European Publication EP-A 0 784 232; U.S. Pat. Nos. 4,621,044; 4,177,074; and 5,075,192.

The photopolymerizable materials can be applied onto commercial supports and exposed imagewise by current methods. After being developed with the developer of the present invention, the printing forms are dried, followed optionally by a chemical posttreatment and/or postexposure.

EXAMPLES

The following examples illustrate the present invention. Unless otherwise stated, the given parts and percentages are relative to weight.

EXAMPLES AND COMPARISON TESTS

The washoff time in the following examples and comparison examples was determined by measuring relief depths after 10 minutes washoff time. At least two flexographic printing plates were washed off with each developer. The relief was measured in each plate at four points and the average value was taken as the result.

Commercial aqueous-developable Cyrel® AQS flexographic printing plates (for example, 2.90 to 1.70 mm thick) were used. A flexographic printing plate was placed on a frame and exposed in a tube exposure unit (Du Pont Cyrel® 3038E wherein 60 second exposure is 650 mJ/cm$^2$). Unexposed printing plate material was washed off at 50° C. with the aqueous developer being tested in a laboratory device having fixed brushes by rotating the flexographic printing plate.

Comparison Example 1

A solution (using completely deionized water) of 0.5% ethylene diaminotriacetate-coconut alkylacetamide trisodium salt (CAS No. 93 165-97-0) was used as the developer. The relief depth was 0.561 mm.

Example 1

A solution (using completely deionized water) of 0.5% ethylene diaminotriacetate-coconut alkylacetamide trisodium salt (CAS No. 93 125-97-0) and a) 0.5% triethanolamine, b) 0.5% tris(hydroxymethyl)aminomethane and c) 0.25% 3-diethylamino-1,2-propanediol was used as the developer. The relief depths were a) 1.053 mm, b) 1.037 mm, and c) 1.747 mm. These correspond to an increase in washoff efficiency of about a) 88%, b) 85%, and c) 211%, compared to Comparison Example 1.

Example 2

A solution (using completely deionized water) of 0.5% ethylene diaminotriacetate-coconut alkylacetamide trisodium salt (CAS No. 93 165-97-0) and a) 0.5% nitrilotriacetic acid was used as the developer. The relief was 0.840 mm. This corresponds to an increase in washoff efficiency of about 50%, compared to Comparison Example 1.

Comparison Example 2

A solution (using completely deionized water) of 0.5% sodium lauryl sulfate was used as the developer. The relief depth was 0.616 mm.

Example 3

A solution (using completely deionized water) of 0.5% sodium lauryl sulfate and 0.5% tris(hydroxymethyl) aminomethane was used as the developer. The relief depth was 1.126 mm. This corresponds to an increase in washoff efficiency of about 83%, compared to Comparison Example 2.

Comparison Example 3

A solution (using completely deionized water) of 0.5% Tegotens® V20 (a surfactant of the polyoxyethylene glycerol oleoricinolate type) from the Goldschmidt Company was used as the developer. The relief depth was 0.688 mm.

Example 4

A solution (using completely deionized water) of 0.5% Tegotens® V20 (a surfactant of the polyethylene glycerol oleoricinolate type) from the Goldschmidt Company and 0.2% 3-di-ethylamino-1,2-propanediol was used as the developer. The relief depth was 1.707 mm. This corresponds to an increase in washoff efficiency of about 55% compared to Comparison Example 3.

Comparison Example 4

A solution (Using completely deionized water) of 1.0% sodium lauryl sulfate (solution pH 8.3) was used as the developer. The relief depth was 0.680 mm.

Comparison Example 5

A solution (using completely deionized water) of 1.0% ethylene diaminotriacetate-coconut alkylacetamide trisodium salt (CAS No. 93-165-97-0) (solution pH 11.0) was used as the developer. The relief depth was 0.660 mm.

Comparison Example 6

A solution (using completely deionized water) of 1.0% of the sodium salt of diisooctylsulfo-succinate (solution pH 8.3) was used as the developer. The relief depth was 0.525 mm.

Example 5

A solution (using completely deionized water) of 0.5% sodium lauryl sulfate and 0.5% ethylene diaminotriacetate-coconut alkylacetamide trisodium salt (CAS No. 93 165-97-0) (solution pH 11.0) was used as the developer. The relief depth was 0.780 mm. This corresponds to an increase in washoff efficiency of about 15%, compared to Comparison Example 4, and about 18%, compared to Comparison Example 5.

Example 6

A solution (using completely deionized water) of 0.5% sodium lauryl sulfate and 0.5% diisooctylsulfo-succinate (solution pH 7.3) was used as the developer. The relief depth was 0.820 mm. This corresponds to an increase in washoff efficiency of about 21%, compared to Comparison Example 4, and about 56%, compared to Comparison Example 6.

Example 7

A solution (using completely deionized water) of 0.3% sodium lauryl sulfate, 0.3% ethylene diaminotriacetate-coconut alkylacetamide trisodium salt (CAS No. 93 165-97-0), and 0.3% of the sodium salt of diisooctyl sulfosuccinate (solution pH 10.6) was used as the developer. The relief depth was 0.775 mm. This corresponds to an increase in washoff efficiency of about 14%, compared to Comparison Example 4, about 17%, compared to Comparison Example 5, and about 48%, compare to Comparison Example 6.

What is claimed is:

1. A process for preparing flexographic printing forms comprising:
   a) imagewise exposing a flexographic recording material comprising a support and at least one photopolymerizable layer crosslinkable by actinic radiation, with actinic radiation to crosslink the exposed areas of the layer;
   b) washing off uncrosslinked areas of the layer with an aqueous developer; and
   c) drying the recording material of step b),
wherein the aqueous developer consists essentially of a combination selected from the group consisting of: a combination of at least one amino alcohol with at least one surfactant; a combination of at least one amino carboxylic acid with at least one surfactant; a combination of at least one amino alcohol and at least one amino carboxylic acid with at least one surfactant; and, a combination of at least two surfactants.

2. The process of claim 1, wherein the at least one amino alcohol is of the formula $R^1_x R^2_y R^3_z N$, wherein $R^1$=H; $R^2$=—$C_n H_{2n+1-m}$—$(OH)_m$; $R^3$ =alkyl, aryl, substituted alkyl, or substituted aryl groups; x=0–3; y=1–3; z=0–2; n=1–15; m=n–1; and x'y+z=3.

3. The process of claim 1, wherein the amino alcohol is selected from the group consisting of triethanolamine; 3-diethylamino-1,2-propanediol; and tris(hydroxymethyl) aminomethane.

4. The process of claim 1, wherein the amino alcohol is present 0.05 to 2.0 percent by weight.

5. The process of claim 1, wherein the at least one amino carboxylic acids is of the formula $R^1_x R^2_y R^3_z N$, wherein $R^1$=H; $R^2$=—$C_n H_{2n+1-m}$—$(COOH)_m$; $R^3$ =alkyl, aryl, substituted alkyl, or substituted aryl groups; x=0–3; y=1–3; z=0–2; n=1–15; m=n–1; and x+y+z=3.

6. The process of claim 1, wherein the at least one amino carboxylic acid is selected from the group consisting of nitrilotriacetic acids; serin; aspartic acid; and polyaspartic acid.

7. The process of claim 1, wherein the aqueous developer contains 0.05 to 2.0 percent by weight of the amino carboxylic acid(s).

8. The process of claim 1, wherein the aqueous developer contains 0.1 to 5 percent by weight of the surfactant(s).

9. The process of claim 1, wherein the surfactants are selected from the group consisting of ethylene-diamino triacetate-coconut alkylacetamide trisodium salt, diisooctyl sulfosuccinate sodium salt, sodium lauryl sulfate, and polyoxyethylene glycerol oleoricinolate.

10. The process of claim 1 wherein the aqueous developer has a pH of 7.3 to 11.0.

* * * * *

UNITED STATES PATENT AND TRADEMARK OFFICE
CERTIFICATE OF CORRECTION

PATENT NO.     : 6,506,542 B1
DATED          : January 14, 2003
INVENTOR(S)    : Ursula A. Kraska and Rudolf Leonhard Osowski It is certified that error appears in the above-identified patent and that said Letters Patent is hereby corrected as shown below:

<u>Column 5,</u>
Line 24, "x'y + z = 3" should read -- x + y + z = 3 --

Signed and Sealed this

Twenty-fourth Day of June, 2003

JAMES E. ROGAN
*Director of the United States Patent and Trademark Office*